United States Patent
Ueno

(10) Patent No.: US 7,521,318 B2
(45) Date of Patent: Apr. 21, 2009

(54) SEMICONDUCTOR DEVICE AND METHOD OF MANUFACTURING THE SAME

(75) Inventor: Koki Ueno, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 309 days.

(21) Appl. No.: 11/392,562

(22) Filed: Mar. 30, 2006

(65) Prior Publication Data
US 2006/0220088 A1  Oct. 5, 2006

(30) Foreign Application Priority Data
Mar. 31, 2005  (JP) ............................. 2005-101445

(51) Int. Cl.
*H01L 21/336* (2006.01)
(52) U.S. Cl. ...................... 438/257; 438/201; 438/294; 438/296; 257/E21.179; 257/E21.54; 257/E21.68
(58) Field of Classification Search ................ 438/195, 438/196, 176, 181, 209; 257/E21.177, E21.179
See application file for complete search history.

(56) References Cited

U.S. PATENT DOCUMENTS

2004/0232514 A1   11/2004  Arai et al.
2005/0012173 A1*  1/2005  Sheu et al. ................... 257/519
2005/0258463 A1   11/2005  Yaegashi et al.
2006/0043456 A1*  3/2006  Derderian et al. ........... 257/314

FOREIGN PATENT DOCUMENTS

JP    11-340461    12/1999

* cited by examiner

*Primary Examiner*—Walter L Lindsay, Jr.
*Assistant Examiner*—Cheung Lee
(74) *Attorney, Agent, or Firm*—Oblon, Spivak, McClelland, Maier & Neustadt, P.C.

(57) ABSTRACT

A semiconductor device is disclosed, which includes a semiconductor substrate including a device region and an isolation region having an isolation trench, a gate electrode formed on the device region through a gate insulating film, a first isolation insulating film formed in the isolation trench, the first isolation insulating film having a recess, a second isolation insulating film formed on the first isolation insulating film to be filled in the recess, the second isolation insulating film having an upper surface higher than the upper surface of the semiconductor substrate, and an impurity region formed in the semiconductor substrate under the first isolation insulating film, the impurity region having a conductivity type the same as a conductivity type of the semiconductor substrate, an impurity concentration higher than an impurity concentration of the semiconductor substrate, and a width of the impurity region smaller than a width of the isolation trench.

7 Claims, 3 Drawing Sheets

SEMICONDUCTOR DEVICE AND METHOD OF MANUFACTURING THE SAME

CROSS-REFERENCE TO RELATED APPLICATIONS

This application is based upon and claims the benefit of priority from prior Japanese Patent Application No. 2005-101445, filed Mar. 31, 2005, the entire contents of which are incorporated herein by reference.

BACKGROUND OF THE INVENTION

1. Field of the Invention

The present invention relates to a semiconductor device, and a method of manufacturing the same. In particular, the present invention relates to a semiconductor device including a non-volatile memory cell isolated by a shallow trench isolation (STI) region, and a method of manufacturing the same. For example, the present invention is applicable to a non-volatile semiconductor memory device such as a NAND flash memory, and a method of manufacturing the same.

2. Description of the Related Art

In a semiconductor device, for example, non-volatile memory cell, a shallow trench isolation (STI) region is formed in a semiconductor substrate to isolate a micro memory cell (cell transistor) included in a memory cell array. The non-volatile memory having the STI structure has a need to take the following problems into consideration. Specifically, if an impurity concentration of a well region in which a memory cell is formed is low, the memory cell will easily be broken down in the following cases, and as a result, becomes failure. One is the case where a breakdown voltage against punch through between adjacent memory cells is low. Another is the case where a breakdown voltage against field inversion is low when high voltage is applied to the gate of a cell transistor. In order to increase the punch through breakdown voltage and field inversion breakdown voltage, a following method has been proposed. According to the method, the depth of a trench of the STI region is made deep, or the impurity concentration of a well region is made high. However, the method of making the depth of the trench of the STI region deep has a following problem. That is, it is difficult to sufficiently make the trench deep because the etching condition is restricted with scale-down of device region and isolation region. On the other hand, according to the method of increasing the impurity concentration of the well region, the back-bias characteristic of a transistor is degraded, and as a result, the impurity concentration of the well region cannot not be sufficiently increased.

If the width of the STI region is large, there has been proposed a following method. According to the method, a portion of the STI region is opened by photolithography, and thereafter, impurities are introduced into a portion of a semiconductor substrate under the portion of the STI region to form a punch through restricting region (field stopper region). However, this method has a following problem. For example, in a NAND flash memory having a large capacity, the width of the STI region between cell transistors connected in series in a memory cell array is very small. It is difficult to form an opening smaller than the STI region at a desired position of such a small-size STI region. The opening formed is generally undesirably displaced from the predetermined position, and thus, the distance between the punch through stopper region and device region are too close from each other, resulting in degradation of the device characteristic.

Incidentally, the following technique has been disclosed in forming DRAM (Dynamic Random Access Memory) or SRAM (Static Random Access Memory). According to the technique, a STI trench is formed using etching, and then, a silicon oxide film is formed on the side wall of the STI trench. A silicon nitride film is deposited on the silicon oxide film. Thereafter, an opening is formed in the bottom portion of the STI trench. Impurity ions are implanted through an opening of the STI trench into a portion of a semiconductor substrate to form a punch through stopper region. Thereafter, the STI trench is filled with a silicon oxide film to form a STI region. See JPN. PAT. APPLN. KOKAI Publication No. 11-340461.

BRIEF SUMMARY OF THE INVENTION

According to an aspect of the present invention, there is provided a semiconductor device comprising:

a semiconductor substrate including a device region and an isolation region having an isolation trench;

a gate electrode formed on the device region through a gate insulating film formed on an upper surface of the semiconductor substrate;

a first isolation insulating film formed in the isolation trench, the first isolation insulating film having a recess;

a second isolation insulating film formed on the first isolation insulating film to be filled in the recess, the second isolation insulating film having an upper surface higher than the upper surface of the semiconductor substrate; and an impurity region formed in the semiconductor substrate under the first isolation insulating film, the impurity region having a conductivity type the same as a conductivity type of the semiconductor substrate, an impurity concentration higher than an impurity concentration of the semiconductor substrate, and a width of the impurity region smaller than a width of the isolation trench.

According to another aspect of the present invention, there is provided a method of manufacturing a semiconductor device including a memory cell transistor array having a gate structure a floating gate electrode and a control gate electrode on a semiconductor substrate, comprising:

forming an isolation trench in self-alignment with floating gate electrodes of adjacent memory cell transistors on a surface layer of a semiconductor substrate;

forming a first isolation insulating film of a first isolative material in the isolation trench in such a manner that a recess configured by the first isolation insulating film is formed in the isolation trench;

implanting impurity ions into the semiconductor substrate under the isolation trench through the recess and the first isolation insulating film to form an impurity region in the semiconductor substrate in self-alignment with the recess;

after the implanting of the impurity ions, filling a second isolative material in the recess to form a second isolation insulating film of the second isolative material in the recess; and activating the implanted impurity ions before or after the second isolation insulating film is formed.

DETAILED DESCRIPTION OF THE INVENTION

Figure 1:
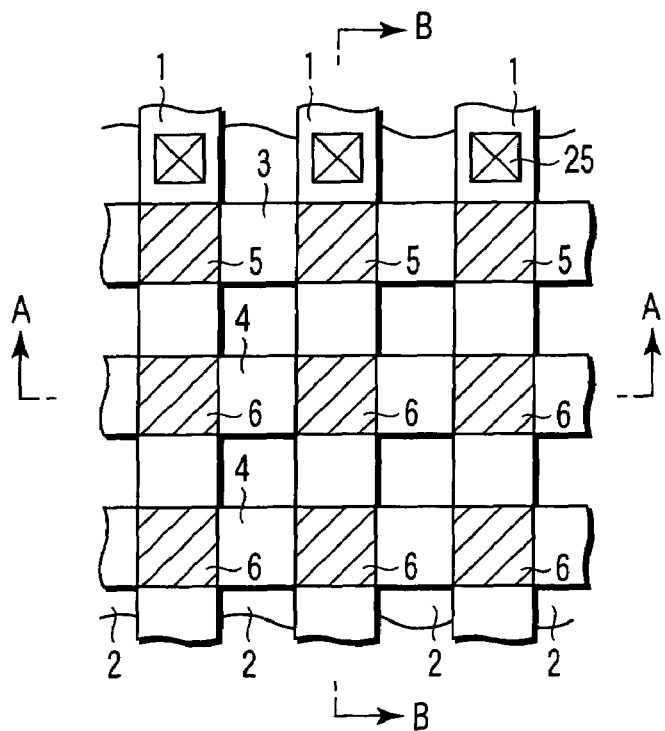
FIG. 1 is a top plan view schematically showing part of the configuration of a memory cell array of a NAND flash memory according to an embodiment of the present invention.

An embodiment of the present invention will be described below with reference to the accompanying drawings. In the following description, the same reference numerals are used to designate same or similar portions.

FIG. 1 is a top plan view schematically showing part of the configuration of a memory cell array of a NAND type non-volatile memory according to an embodiment of the present invention;

As shown in FIG. 1, each of NAND cell units of a NAND type memory cell array is formed of a plurality of memory cells 6 serial-connected in the column direction, and a select transistor 6 is connected to one terminal of the serial connection of the memory cells. Memory cells 6 arrayed in the same row are connected to a common control gate line (word line) 4. Select transistors 5 arrayed in the same row are connected to a common select gate line 3. One terminal (drain) of each of the select transistors 5 is connected to a bit line 1 through a bit line contact 25.

Figure 2:
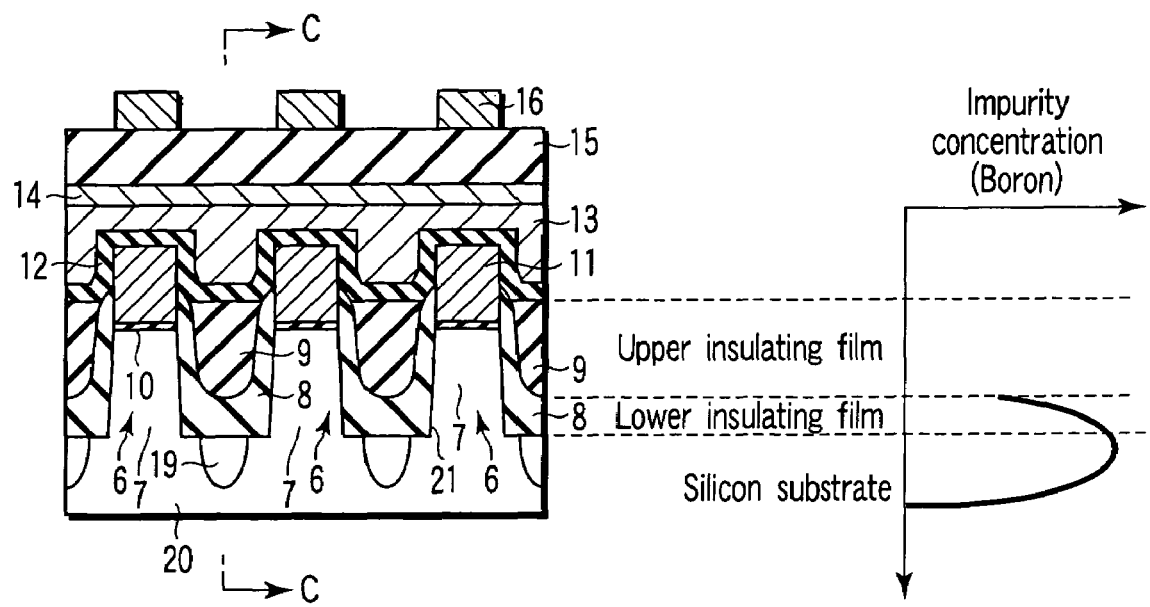
FIG. 2 is a cross-sectional view taken along the line A-A (word line direction) of the memory cell array of FIG. 1, together with a characteristic chart showing an impurity concentration profile of an isolation insulating film of an isolation region and a portion of the semiconductor substrate under the isolation insulating film in the depth direction.

FIG. 2 is a cross-sectional view taken along the line A-A (word line direction, that is, row direction) of the memory cell array of FIG. 1, with a characteristic chart showing an impurity concentration profile in a cross section taken along the line C-C (depth direction of the isolation insulating films and a portion of the semiconductor substrate under the isolation insulating film) of the cell array.

As illustrated in FIG. 2, a semiconductor substrate (e.g., p-conductivity type silicon substrate) 20 is provided with a plurality of device formation regions (active regions) 7 in a form of array. An isolation trench 21 is provided between the device formation regions 7 in the word line direction. A memory cell 6 is formed in each of the device formation regions 7. In a cross sectional view, not shown, taken along a line crossing over the select transistors 5 (FIG. 1) in the array direction, the select transistors 5 are formed in the respective device formation regions 7.

Figure 3:
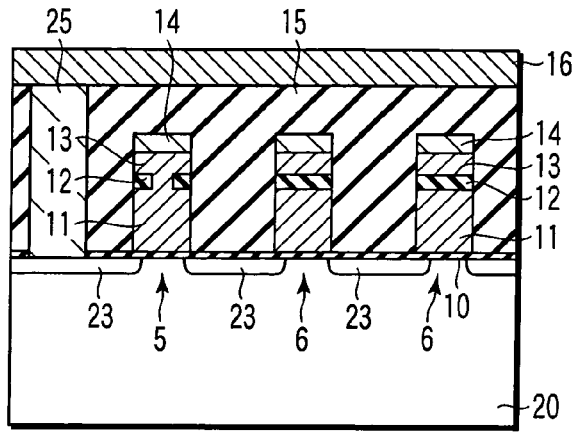
FIG. 3 is a cross-sectional view taken along the line B-B (bit line direction) of the memory cell array of FIG. 1.

FIG. 3 is a cross-sectional view taken along the line B-B (bit line direction) of the memory cell array of FIG. 1;

As seen from FIG. 3, adjacent memory cells 6 in the bit line direction share a source/drain diffusion layer 23 of the NAND cell unit. Moreover, the memory cell 6 and the select transistor 5 adjacent to the memory cell 6 in the bit line direction share the source/drain diffusion layer 23. One terminal (drain diffusion layer 23) of the select transistor 5 is connected to the bit line contact 25.

The memory cell 6 includes a lower gate insulating film (tunnel insulting film) 10, a floating gate electrode 11, an upper gate insulating film (inter-gate insulating film) 12, and a control gate electrode. In this embodiment, the upper gate insulating film (inter-gate insulating film) 12 comprises an ONO (Oxide-Nitride-Oxide) film. The ONO film is formed of a silicon oxide film, a silicon nitride film and a silicon oxide film successively stacked. However, the inter-gate insulating film 12 is not limited to the ONO film. The films given below may be used, instead. One is a film comprised of a single layer, that is, a silicon oxide film only. Another is a film comprised of a single layer, that is, a silicon nitride film only. Another is a two-layer film comprised of a silicon oxide film and a silicon nitride film, which are successively stacked, or a two-layer film comprised of a silicon nitride film and a silicon oxide film, which are successively stacked. In this embodiment, the control gate electrode comprises a stacked layer in which a poly-silicon film 13 and a tungsten silicide film (WSi film) 14 are stacked. However, the control gate electrode is not limited to the two-layer film. For example, a stacked layer of a poly-silicon film and a poly-silicon silicide film may be used. A film comprised of a single layer, that is, a poly-silicon film only may also be used.

The isolation trench 21 is formed in the surface layer of the semiconductor substrate 20. The isolation trench 21 is formed between adjacent device formation regions 7 in the word line direction. The trench 21 is isolation formed in self-alignment with the floating gate electrode 11. The isolation trench 21 is filled successively with first and second isolation insulating films 8 and 9 to form a trench isolation region. In the isolation region, the first isolation insulating film 8 is formed in the isolation trench 21 in such a manner that the first isolation insulating film 8 upwardly extends from the bottom of the isolation trench 21 to the sidewall of the floating gate electrode 11 to form a recess constituted by the first isolation insulating film 8. The recess of the first isolation insulating film 8 is filled with the second isolation insulating film 9 by coating an isolative material. These isolation insulating films 8 and 9 are made of materials different from each other.

A control gate line 4 is provided on the isolation region formed of the isolation insulating films 8 and 9 through the inter-gate insulating film 12. The control gate line 4 is formed of the same layer as the control gate electrode comprised of a stacked film of the films 13 and 14 so that the control gate line 4 and the control gate electrode are formed in a form of a continuous layer. An impurity region 19 having the same conductivity type as the semiconductor substrate 20 is formed in a portion of the semiconductor substrate 20 under the first isolation insulating film 8. The impurity diffusion region 19 is formed in a following manner. Specifically, the first isolation insulating film 8 is formed, and thereafter, impurity (e.g., boron) is implanted into the portion of the semiconductor substrate 20 under the first isolation insulating film 8 through the first isolation insulating film 8. Then, the implanted impurity is activated by heating process, thereby forming the impurity diffusion region 19. The impurity diffusion region 19 has an impurity concentration higher than the semiconductor substrate 20, and functions as a punch through stopper region.

The impurity diffusion region 19 has a width smaller than the isolation trench 21 such that the impurity implanted in the impurity diffusion region 19 gives no influence to the characteristic of a device formed in the device formation region 7. For example, if the width of the isolation trench 21 is 70 nm, the width of the impurity diffusion region 19 is set to about 40 nm. The distance from an edge of the impurity diffusion region 19 to an edge of the isolation trench 21 is about 15 nm.

The memory cell 6 and select transistor 5 have substantially the same structure. In the select transistor 5, the floating gate electrode 11 is connected to the control gate electrode (stacked film comprising films 13 and 14) through a via contact (see FIG. 3) formed on the inter-gate insulating film 12. Incidentally, the floating gate electrode 11 of the memory cell 6 and the floating gate electrode 11 of the select transistor 5 are simultaneously formed. Moreover, the inter-gate insulating film 12 and the control gate electrode (stacked film comprising films 13 and 14) are simultaneously formed.

The entire surface of the semiconductor substrate formed with the memory cell 6 and select transistor 5 is coated with an interlayer insulating film 15. A bit line 16 in each of the columns is formed on the interlayer insulating film 15. The bit line 16 is connected to a drain diffusion layer 23 of the select transistor 5 of the corresponding NAND cell unit through a bit line contact 25 formed in the interlayer insulating film 15.

As described above, the impurity region 19 is formed in a manner that the first isolation insulating film 8 is formed and thereafter, impurity (e.g., boron) is implanted into the semiconductor substrate 20 through the first isolation insulating film 8. Therefore, boron exists in the first isolation insulating film 8 and a portion of the silicon substrate 20 under the first isolation insulating film 8. However, almost no boron exists in the second isolation insulating film 9. According to this embodiment, the boron concentration peak of the silicon substrate 20 is set to about $1 \times 10^{16}$ cm$^{-3}$. The impurity region 19 is formed, and thereafter, the second isolation insulating film 9 is formed.

According to the embodiment, in the cell array of a NAND type non-volatile memory having the floating gate electrode 11 and the control gate electrode formed of films 13 and 14, the first isolation insulating film 8 is so formed in the trench in the device isolation region as to form a recess configured by the first isolation insulating film 8. Thereafter, impurity is implanted through the recess so that the impurity region 19 is formed in the semiconductor substrate 20 under the isolation region 8 in self-alignment with the recess. This improves punch through breakdown voltage and field inversion breakdown voltage between adjacent device regions without adding high-precious photolithography process. Moreover, the device formation region 7 and the impurity region 19 are away from each other to some extent. This serves to prevent the back-bias characteristic of the device from being degraded by impurity of the impurity region 19. As a result, device performance is enhanced without increasing the manufacture cost.

The process of manufacturing a semiconductor device according to the embodiment will be explained below with reference to FIG. 4 to FIG. 13. FIG. 4 to FIG. 13 correspond to the cross section taken along the line A-A of FIG. 1.

According to the embodiment, the following method is employed to prevent degrading of characteristics of the device. Specifically, a first isolation insulating film having good quality is deposited in the isolation trench, and thereafter, a second isolation insulating film having a quality is deposited on the first isolation insulating film. The quality of the second isolation insulating film is slightly inferior to that of the first isolation insulating film, however, the material of the second isolation insulating film is easy to be embedded.

Figure 4:
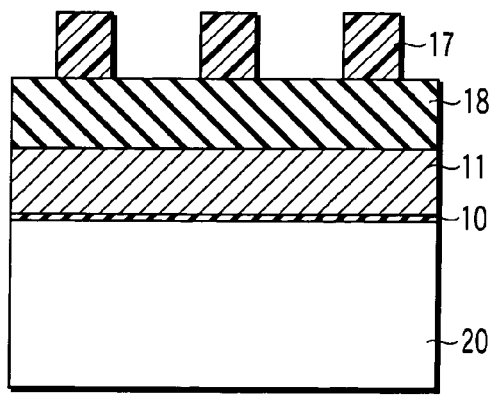
FIG. 4 is a cross-sectional view of a semiconductor device structure to explain a process of manufacturing the NAND flash memory according to the embodiment of the present invention.

As shown in FIG. 4, a semiconductor substrate 20 such as a silicon substrate is prepared. A tunnel-gate insulating film 10, that is, a silicon oxide film having a thickness of about 10 nm is formed on a surface of the semiconductor substrate 20 by thermal oxidation.

In order to form a floating gate electrode, a poly-silicon film 11 having a thickness of about 160 nm is formed on the tunnel-gate insulating film 10 by low pressure chemical vapor deposition (LP-CVD). A silicon nitride film 18 having a thickness of about 90 nm is further formed on the poly-silicon film 11 by LP-CVD. The silicon nitride film 18 functions as a stopper film in a chemical mechanical polishing (CMP) process. Photo resist is coated on the silicon nitride film 18, and thereafter, the coated photo resist is pattern by a lithography technique to form a photo resist pattern 17.

Figure 5:
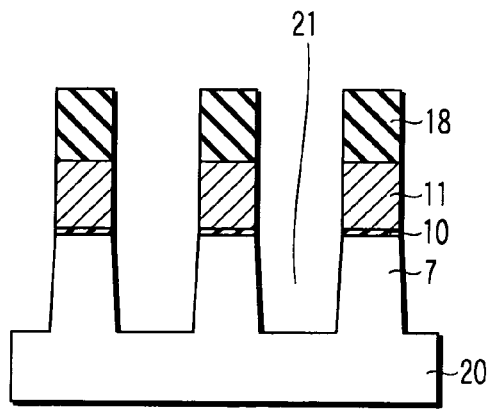
FIG. 5 is a cross-sectional view of a semiconductor device structure to explain a process, following the process of FIG. 4, of manufacturing the NAND flash memory according to the embodiment of the present invention.

As depicted in FIG. 5, the silicon nitride film 18, poly-silicon film 11, tunnel-gate insulating film 10 and semiconductor substrate 20 are successively etched by isotropic etching. In this case, the photo resist pattern 17 is used as an etching mask. As a result, patterned nitride film 18, poly-silicon film (floating gate electrode) 11 and tunnel-gate insulating film 10 are provided. Also, by the isotropic etching, the semiconductor substrate 20 is provided with an isolation trench 21 having a depth of about 220 nm. By provision of the isolation trench 21, the semiconductor substrate 20 is provided with a device formation region 7 isolated by the isolation trench 21.

Figure 6:
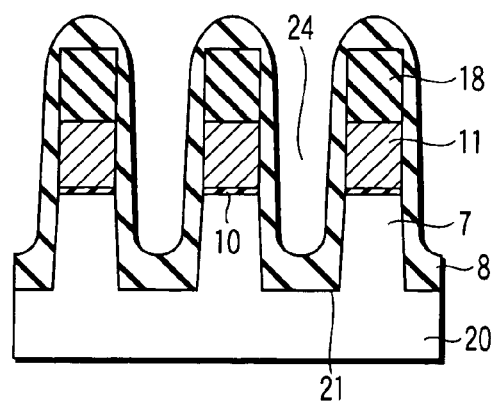
FIG. 6 is a cross-sectional view of a semiconductor device structure to explain a process, following the process of FIG. 5, of manufacturing the NAND flash memory according to the embodiment of the present invention.

As illustrated in FIG. 6, a silicon oxide film is formed over the surface of the semiconductor substrate 20 by plasma CVD to form a first isolation insulating film 8 covering from the inside of the isolation trench 21 to the upper portion of the silicon nitride film 18. In this case, the thickness of the silicon oxide film 8, which covers from the bottom of the isolation trench 21 to the upper end of the silicon nitride film 18, in other words, extends in the longitudinal direction in FIG. 6, is smaller than ½ of the width of the isolation trench 21, so that a recess 24 configured by the silicon oxide film 8 is formed in the isolation trench 21, i.e., the isolation trench is not fully filled. To obtain the silicon oxide film 8 as such, conditions of the plasma CVD are determined considering the width and depth of the isolation trench 21. Moreover, the thickness of the silicon oxide film 8 is set larger than a distance in which impurity implanted into the semiconductor substrate 20 through the silicon oxide film 8 is diffused in the semiconductor substrate 20 by heating at a later process. This will be described later. In this embodiment, the thickness of the silicon oxide film 8 is set to about 200 nm in a planer region, not shown, i.e., the surface region of the semiconductor substrate 20. In this case, the thickness of the first isolation insulating film 8, which covers from the inside of the isolation trench 21 to the upper end of the silicon nitride film 18, is about 20 nm.

Figure 7:
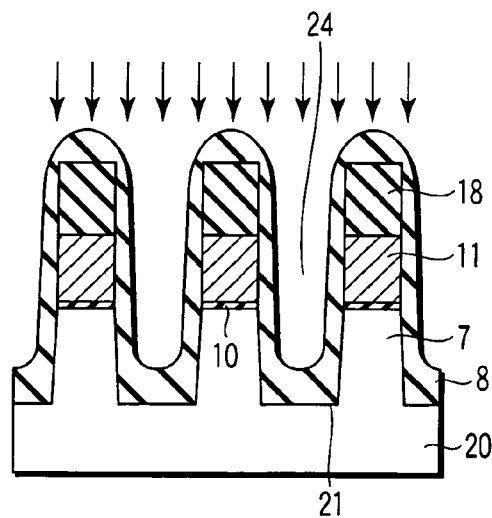
FIG. 7 is a cross-sectional view of a semiconductor device structure to explain a process, following the process of FIG. 6, of manufacturing the NAND flash memory according to the embodiment of the present invention.
Figure 8:
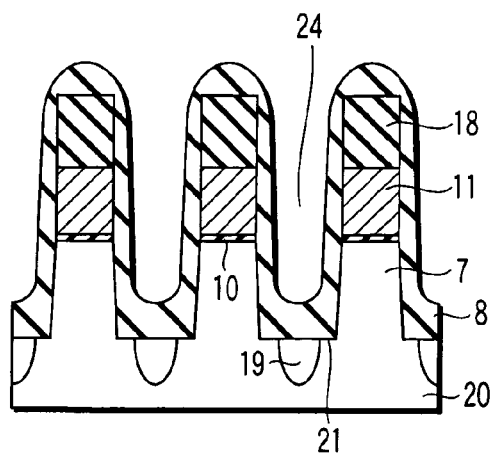
FIG. 8 is a cross-sectional view of a semiconductor device structure to explain a process, following the process of FIG. 7, of manufacturing the NAND flash memory according to the embodiment of the present invention.

As shown in FIG. 7, impurity ions are implanted through the silicon oxide film 8. In this case, sufficient acceleration voltage is set so that impurity passes through the first isolation insulating film 8 on the bottom of the isolation trench 21. According to this embodiment, p-conductivity type impurity (e.g., boron) is implanted at an acceleration voltage of 70 keV. The impurity is introduced into the semiconductor substrate 20 through the first isolation insulating film 8 on the bottom of the isolation trench 21. However, the impurity does not pass through the silicon oxide film 8 covering from the bottom of the isolation trench 21 to the upper end of the silicon nitride film 18. As a result, an impurity region 19 is formed only at a portion of the silicon substrate 20 under the recess 24, as shown in FIG. 8.

Figure 9:
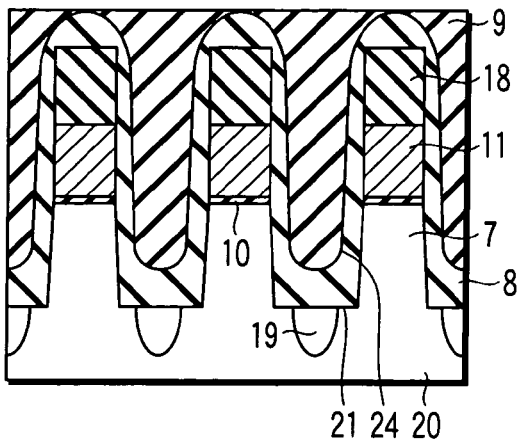
FIG. 9 is a cross-sectional view of a semiconductor device structure to explain a process, following the process of FIG. 8, of manufacturing the NAND flash memory according to the embodiment of the present invention.

As illustrated in FIG. 9, polysiloxane is coated over the surface of the semiconductor substrate by a Spin On Glass method and then heat treatment is carried out in a water vapor-added oxidizing atmosphere to densify the polysiloxane, so that a second isolation insulating film 9 is embedded in the recess 24 configured by the first isolation insulating film 8. This provides the second isolation insulating film 9 formed of polysiloxane. As described above, a coating film such as polysiloxane is used as the second isolation insulating film 9, and thus, the following advantage is obtained. Specifically, even if the recess 24 is deep, the second isolation insulating film 9 is easily formed in the recess 24. In this case, as the need arises, areas, e.g., a peripheral circuit area, other than the memory cell array are covered by a mask. However, there is no need of carrying out high-precious photolithography process to form the mask.

Figure 10:
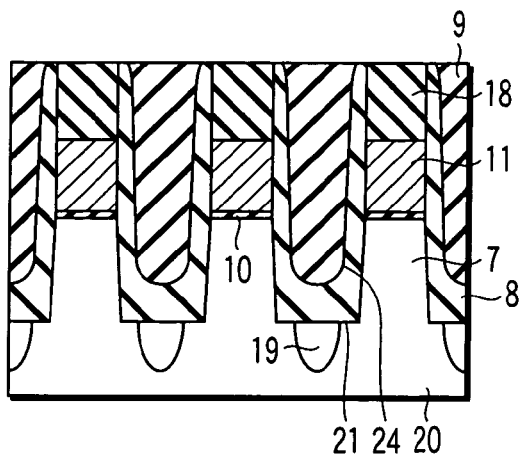
FIG. 10 is a cross-sectional view of a semiconductor device structure to explain a process, following the process of FIG. 9, of manufacturing the NAND flash memory according to the embodiment of the present invention.

As depicted in FIG. 10, portions of the first and second isolation insulating films 8 and 9, which are outside the isolation trench 21, are removed by CMP or resist etch-back, so that the surface of the substrate is planarized. In the removing process, the silicon nitride film 18 functions as a stopper.

Figure 11:
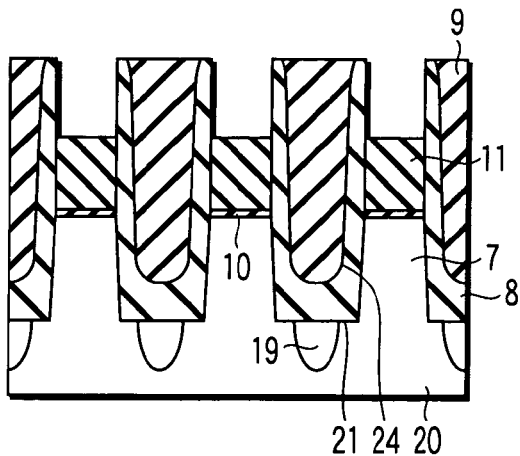
FIG. 11 is a cross-sectional view of a semiconductor device structure to explain a process, following the process of FIG. 10, of manufacturing the NAND flash memory according to the embodiment of the present invention.

As seen from FIG. 11, the silicon nitride film 18 is removed to expose the upper surface of the poly-silicon film 11.

Figure 12:
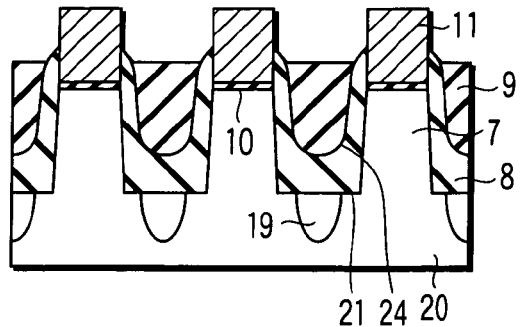
FIG. 12 is a cross-sectional view of a semiconductor device structure to explain a process, following the process of FIG. 11, of manufacturing the NAND flash memory according to the embodiment of the present invention.

As shown in FIG. 12, portions of the first and second isolation insulating films 8 and 9 are removed by etching so that the sidewall of the poly-silicon film 11 is exposed from its upper end to a portion at a predetermined depth. In this etching, the etching rate of the second isolation insulating film 9 is set higher than that of the first isolation insulating film 8. In this embodiment, the etching is carried out using buffer hydrofluoric acid (mixed solution of hydrofluoric acid and ammonium fluoride). Since buffer hydrofluoric acid is used in this etching, the etching rate (selectivity) of the polysiloxane 9 can be higher than that of the silicon oxide film 8. Hydrofluoric vapor may be used in place of buffer hydrofluoric acid.

Figure 13:
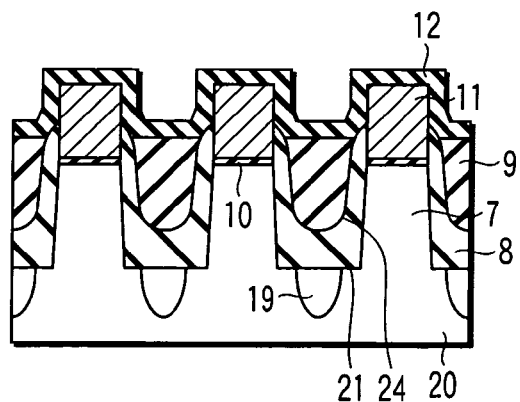
FIG. 13 is a cross-sectional view of a semiconductor device structure to explain a process, following the process of FIG. 12, of manufacturing the NAND flash memory according to the embodiment of the present invention.

As seen from FIG. 13, an ONO film having a predetermined thickness is formed as an inter-gate insulating film 12 by LP-CVD. It is sufficient that inter-gate insulating film 12 is formed only on the exposed surface of the poly-silicon film 11. However, in this embodiment, the film 12 is formed to cover not only the exposed surface of the poly-silicon film 11 but also the upper surface of the first and second isolation insulating films 8 and 9. By doing so, control gate electrodes 13, 14 (FIGS. 2 and 3) formed on the inter-gate insulating film 12 and the device formation region 7 are securely isolated from each other. The inter-gate insulating film 12 on the select transistor 5 is partly removed by etching to partially expose the poly-silicon film 11 of the select transistor 5.

Before the tunnel gate insulating film 10 is formed, ions for adjusting a threshold value are implanted into the surface layer of the semiconductor substrate 20 so that a cell transistor has a desired electric characteristic. In addition, after the isolation region is formed, ions are implanted into the surface layer of the semiconductor substrate 20 so that the diffusion region 23, which has a high impurity concentration and a conductivity type opposite to that of the semiconductor substrate 20, is formed to provide source/drain regions in the device formation region 7.

Thereafter, the poly-silicon film 13 and tungsten silicide film (WSi film) 14, as shown in FIG. 2 and FIG. 3, are formed successively over the surface of the semiconductor substrate. Then, these films 13 and 14 are patterned, and thereby, control gate electrodes are formed. As described before, the inter-gate insulating film 12 on the select transistor 5 is partly removed by etching to partially expose the poly-silicon film 11 of the select transistor 5. Hence, in the select transistor 5, the poly-silicon films 13 and 11 are connected to each other through the removed portion of inter-gate insulating film 12.

As depicted in FIG. 2 and FIG. 3, an insulating film such as silicon oxide film is deposited as the first interlayer insulating film 15. As seen from FIG. 3, a contact hole is formed at a desired position of the first interlayer insulating film 15 to form a bit line contact. The formed contact hole is filled with a contact plug 25. Thereafter, in order to form the bit line 16, a metal interconnect (bit line) 16 is formed on the first interlayer insulating film 15, as illustrated in FIG. 2 and FIG. 3. The metal interconnect (bit line) 16 electrically contacts with the high-concentration diffusion region 23 through the contact plug 25.

Then, interlayer insulating films and upper-layer interconnects are formed, and thereafter, the entire surface of the substrate is coated with a protection film such as silicon nitride film, so that a semiconductor device is completed.

According to the manufacturing method, the following process is provided to form a trench isolation region in a cell array of a non-volatile memory having floating gate and control gate. Specifically, the first isolation insulating film 8 is formed in the inside of the isolation trench 21 along the surface of the isolation trench 21 to form a recess configured by the isolation trench 21, and impurity ions are implanted into the semiconductor substrate through the recess and the first isolation insulating film 8. By doing so, the impurity region 19 is formed in the semiconductor substrate under the isolation region in self-alignment with the recess without using high-precious lithography technique.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, including a memory cell transistor array having a gate structure a floating gate electrode and a control gate electrode on a semiconductor substrate, comprising:

forming an isolation trench in self-alignment with floating gate electrodes of adjacent memory cell transistors on a surface layer of a semiconductor substrate;

forming a first isolation insulating film of a first isolative material in the isolation trench in such a manner that a recess configured by the first isolation insulating film is formed in the isolation trench;

implanting impurity ions into the semiconductor substrate under the isolation trench through the recess and the first isolation insulating film to form an impurity region in the semiconductor substrate in self-alignment with the recess;

after the implanting of the impurity ions, filling a second isolative material in the recess to form a second isolation insulating film of the second isolative material in the recess; and activating the implanted impurity ions before or after the second isolation insulating film is formed, wherein the first isolation insulating film is formed of a silicon oxide film, and the second isolation insulating film is formed of a polysiloxane film.

2. The method of manufacturing a semiconductor device according to claim 1, wherein the second isolation insulating film is formed by embedding an isolative material in the recess configured by the first isolation insulating film.

3. The method of manufacturing a semiconductor device according to claim 1, wherein the impurity region is formed in self-alignment with the recess configured by the first isolation insulating film.

4. The method of manufacturing a semiconductor device according to claim 1, wherein the first isolation insulating film has a film quality superior to a film quality of the second isolation insulating film.

5. The method of manufacturing a semiconductor device according to claim 1, wherein the silicon oxide film is formed by plasma CVD.

6. The method of manufacturing a semiconductor device according to claim 1, wherein the polysiloxane film is formed by polysiloxane coating and heat treatment.

7. The method of manufacturing a semiconductor device according to claim 1, wherein the semiconductor device is a NAND non-volatile memory.

* * * * *